United States Patent
Fredeman et al.

(10) Patent No.: US 10,943,647 B1
(45) Date of Patent: Mar. 9, 2021

(54) BIT-LINE MUX DRIVER WITH DIODE HEADER FOR COMPUTER MEMORY

(71) Applicant: International Business Machines Corporation, Armonk, NY (US)

(72) Inventors: Gregory J. Fredeman, Wappingers Falls, NY (US); Thomas E. Miller, Poughkeepsie, NY (US); Dinesh Kannambadi, Wappingers Falls, NY (US); Kenneth J. Reyer, Stormville, NY (US); Donald W. Plass, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/587,560

(22) Filed: Sep. 30, 2019

(51) Int. Cl.
| | | |
|---|---|---|
| G11C 7/12 | (2006.01) |
| G11C 11/419 | (2006.01) |
| G11C 19/28 | (2006.01) |
| G11C 11/4074 | (2006.01) |
| G11C 11/4094 | (2006.01) |
| G11C 11/24 | (2006.01) |

(52) U.S. Cl.
CPC .............. *G11C 11/419* (2013.01); *G11C 7/12* (2013.01); *G11C 11/24* (2013.01); *G11C 11/4074* (2013.01); *G11C 11/4094* (2013.01); *G11C 19/282* (2013.01)

(58) Field of Classification Search
CPC ....... G11C 7/12; G11C 11/24; G11C 11/4074; G11C 11/4094; G11C 11/419; G11C 19/282
See application file for complete search history.

(56) References Cited

U.S. PATENT DOCUMENTS

| 5,103,425 A | 4/1992 | Kuo et al. |
| 5,365,200 A | 11/1994 | Honnigford et al. |
| 5,760,620 A | 6/1998 | Doluca |
| 6,535,025 B2 | 3/2003 | Terzioglu et al. |

(Continued)

FOREIGN PATENT DOCUMENTS

| CN | 1691204 A | 11/2005 |
| EP | 1815303 B1 | 1/2009 |
| EP | 3273320 A1 | 1/2018 |

OTHER PUBLICATIONS

Fredeman et al., "Negative Voltage Generation for Computer Memory," U.S. Appl. No. 16/587,501, filed Sep. 30, 2019.

(Continued)

*Primary Examiner* — Jay W. Radke
(74) *Attorney, Agent, or Firm* — Cantor Colburn LLP; William Kinnaman

(57) ABSTRACT

A method includes receiving, at a bitline-mux driver circuit, a subarray activation (SUBA) signal and a delay signal. The bitline-mux driver circuit includes a header circuit operable to output a driver voltage to a plurality of driver circuits. The driver voltage is boosted through a voltage divider with diode header circuit based on the SUBA signal to set the driver voltage to a value above a standard supply voltage (VDD) and between a voltage bitline high (VBLH) level and a high voltage (VPP) level. The VPP level exceeds a maximum allowed voltage (VMAX) level of the driver circuits. A master wordline output of the driver circuits is driven to select a bitline mux of a computer memory module based on an address input signal, the delay signal, and the driver voltage.

20 Claims, 5 Drawing Sheets

(56) References Cited

U.S. PATENT DOCUMENTS

| | | |
|---|---|---|
| 7,982,500 B2 | 7/2011 | Luich |
| 8,599,639 B2 | 12/2013 | Akiyama et al. |
| 10,546,641 B1 | 1/2020 | Vahidimowlavi et al. |
| 2001/0012219 A1 | 8/2001 | Lee et al. |
| 2003/0151072 A1 | 8/2003 | Leung et al. |
| 2006/0202741 A1 | 9/2006 | Tran et al. |
| 2012/0206988 A1 | 8/2012 | Song et al. |
| 2013/0163357 A1 | 6/2013 | Buer et al. |
| 2013/0249624 A1 | 9/2013 | Akiyama et al. |

OTHER PUBLICATIONS

Fredeman et al., "Voltage Bitline High (VBLH) Regulation for Computer Memory," U.S. Appl. No. 16/587,496, filed Sep. 30, 2019.

IBM "List of IBM Patents or Patent Applications Treated As Related; (Appendix P)", Filed Sep. 30, 2019, 2 pages.

US 10,943,647 B1

BIT-LINE MUX DRIVER WITH DIODE HEADER FOR COMPUTER MEMORY

BACKGROUND

The present invention generally relates to computer memory, and more specifically, to a bit-line mux driver with a diode header for a computer memory.

Computer memory modules including embedded dynamic random access memory (eDRAM) are widely used for their improved performance in high-speed computing applications. An eDRAM module may include a plurality of cells arranged in an array, each cell being addressed by a word line (WL) and a bit line (BL). Each cell may contain a transistor that may include a high threshold voltage (e.g., thick oxide) n-type metal oxide semiconductor (NMOS) device and a deep trench capacitor. The NMOS gate may be connected to the signal WL which is typically driven to high voltage (VPP), which may be approximately 1.55 volts (V), when writing to or reading from the cell, and a negative voltage (VWL), which may be approximately −0.4V, when a cell is in standby.

SUMMARY

Embodiments of the present invention are directed to a bit-line mux driver with a diode header for a computer memory. A non-limiting example method includes receiving, at a bitline-mux driver circuit, a subarray activation (SUBA) signal and a delay signal. The bitline-mux driver circuit includes a header circuit operable to output a driver voltage to a plurality of driver circuits. The driver voltage is boosted through a voltage divider with diode header circuit based on the SUBA signal to set the driver voltage to a value above a standard supply voltage (VDD) and between a voltage bitline high (VBLH) level and a high voltage (VPP) level. The VPP level exceeds a maximum allowed voltage (VMAX) level of the driver circuits. A master wordline output of the driver circuits is driven to select a bitline mux of a computer memory module based on an address input signal, the delay signal, and the driver voltage.

Other embodiments of the present invention implement features of the above-described method in systems and devices.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

DETAILED DESCRIPTION

Figure 1:
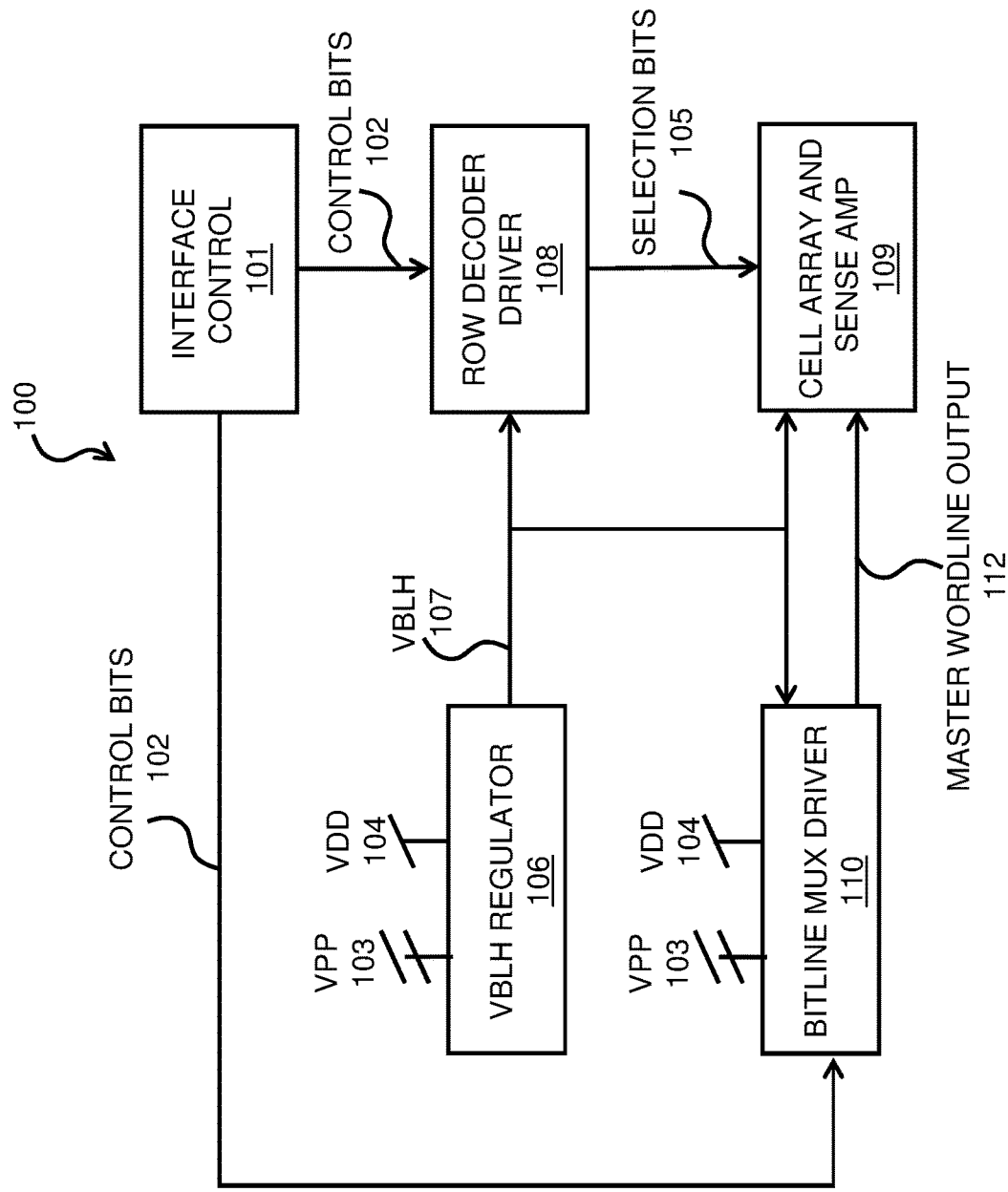
FIG. 1 is a block diagram of components of a memory system with a bitline-mux driver circuit for a computer memory in accordance with one or more embodiments of the present invention.

One or more embodiments of the present invention provide a bitline-mux driver circuit with a diode header. The bitline-mux driver circuit is part of a computer memory that can include voltage bitline high (VBLH) regulation, row decode and drivers, cell array with sense amplifier, and bit-line mux drivers. A computer memory that is used in conjunction with embodiments may be embedded in an integrated circuit, such as a processor chip including embedded memory, such as an embedded dynamic random access memory (eDRAM). A high voltage (VPP) supply in an eDRAM module may violate a maximum allowed voltage (VMAX) of logic devices that are used in row decoders and drivers of a word line (WL) signal, which may be approximately 1.15 volts (V). An eDRAM module may generate a relatively low internal voltage VBLH to avoid VMAX conditions in circuits of the eDRAM module. VBLH may be used to run local bitline and sense amp structures in the eDRAM module. The relatively low voltage level of VBLH may avoid cell disturb fails in the computer memory module. VBLH may be regulated to be lower than the standard supply voltage (VDD) and may vary over a defined range to track process, voltage, temperature (PVT) variables of the memory module. VBLH may track the PVT variables in a relatively limited way to stay in a desired range (e.g., from about 0.7V to about 0.9V) across the PVT range of the operation of the memory module. The VBLH voltage may be programmable in order to compensate for extreme PVT conditions in the computer memory, as well as to compensate for adjustments made to the other voltages.

Memory modules may be internally partitioned into two bitline sides (e.g., a left-side bitline and a right-side bitline) that share a sense amplifier. During a read, the sense amplifier amplifies the signal on the bitline and recharges the capacitor within the memory module to the proper one or zero value. During a write, the sense amplifier drives the bitline to a one or zero to store the data on the capacitor within the memory module. To improve macro array density, the sense amplifier can be shared between two bitlines. To control the biline selection, n-type field effect transistors (NFETs) can be introduced to connect either the left-side bitline or the right-side bitline to the sense amplifier. The NFETs can have gate drivers controlled through the bitline mux driver. Since NFETs are used, logical zero values may pass with a high reliability between the bitline and the sense amplifier, but reliability of passing a logical one through an NFET may depend on the ability to output a higher voltage level to the gate of the NFET. The higher voltage level provided to the gate of the NFET is constrained by VMAX conditions and thus cannot be allowed to reach the high voltage (VPP) level. Embodiments use a voltage divider with diode header circuit to set a driver voltage to a value above a standard supply voltage (VDD) and between a VBLH level and the VPP level, where the VPP level exceeds the VMAX level of driver circuits. Signal timing can be established to allow settling time of voltage boosting before changing an output state of the driver circuits but is also used to allow time for the cell to charge share with the bitline before connecting the bitline to the sense amplifier. A subarray activation signal (SUBA) can be used to selectively enable voltage boosting and reduce power consumption when voltage boosting through the voltage divider with diode header circuit is not needed.

In some embodiments, a VBLH regulator circuit may include a diode stack at an output of the VBLH regulator circuit that creates a current that trickles off of the VBLH output to keep VBLH in a desired range (e.g., from 0.7V to 0.9V). The diode stack may include n-type metal oxide semiconductor (NMOS) and p-type metal oxide semiconductor (PMOS) devices. A threshold voltage (VT) type of the diode stack may mirror the VT type of devices used in the sense amplifiers of the memory module to keep VBLH stable in skewed PVT conditions. To alleviate a VMAX condition in the computer memory, VBLH may be provided into the WL driver and row decode system in a cascoded structure to limit any internal signals to be less than VMAX. The regulator may have a gain of one, such that VBLH goes to the input voltage.

Turning now to FIG. 1, a system 100 for a computer memory is generally shown in accordance with one or more embodiments of the present invention. Embodiments of the system 100 may be embedded in a processor chip that includes eDRAM computer memory. System 100 can include an interface control 101 that generates a plurality of control bits 102 that may configure the operation of the system 100. The control bits 102 may include signals that are provided to the system 100, such as reference voltages, enable/activation signals, delay signals, address signals, and the like in support of memory read, write, and refresh operations. In some embodiments, some of the control bits 102 may be configured during initial set up of the system 100 based on the projected operating conditions (e.g., PVT conditions) of the memory module that contains the system 100, and may not be changed during operation of the memory module including the system 100. System 100 is connected to VPP 103, which may be about 1.55V in some embodiments, and to supply voltage VDD 104. System 100 includes VBLH regulator 106 operable to regulate VBLH 107 to be a relatively low, stable voltage (e.g., 0.7V to 0.9V). The VBLH regulator 106 outputs VBLH 107 to a row decoder driver 108 that also receives control bits 102 and outputs selection bits 105 to a cell array and sense amplifier 109 of the computer memory module. A bitline-mux driver circuit 110 can also receive a portion of the control bits 102 and VBLH 107 to produce a master wordline output 112 for the cell array and sense amplifier 109. Row decoder driver 108, bitline-mux driver circuit 110, and cell array and sense amplifier 109 may be used to perform operations regarding a cell array (e.g., cell reads and writes) of an eDRAM memory module in response to control bits 102, selection bits 105, and master wordline output 112.

It is to be understood that the block diagram of FIG. 1 is not intended to indicate that the system 100 necessarily includes all of the components shown in FIG. 1. Rather, the system 100 can include any appropriate fewer or additional components not illustrated in FIG. 1 (e.g., additional memory components, embedded controllers, functional blocks, connections between functional blocks, modules, inputs, outputs, etc.). Further, the embodiments described herein with respect to system 100 may be implemented with any appropriate logic, wherein the logic, as referred to herein, can include any suitable hardware (e.g., a processor, an embedded controller, or an application specific integrated circuit, among others), software (e.g., an application, among others), firmware, or any suitable combination of hardware, software, and firmware, in various embodiments.

Figure 2:
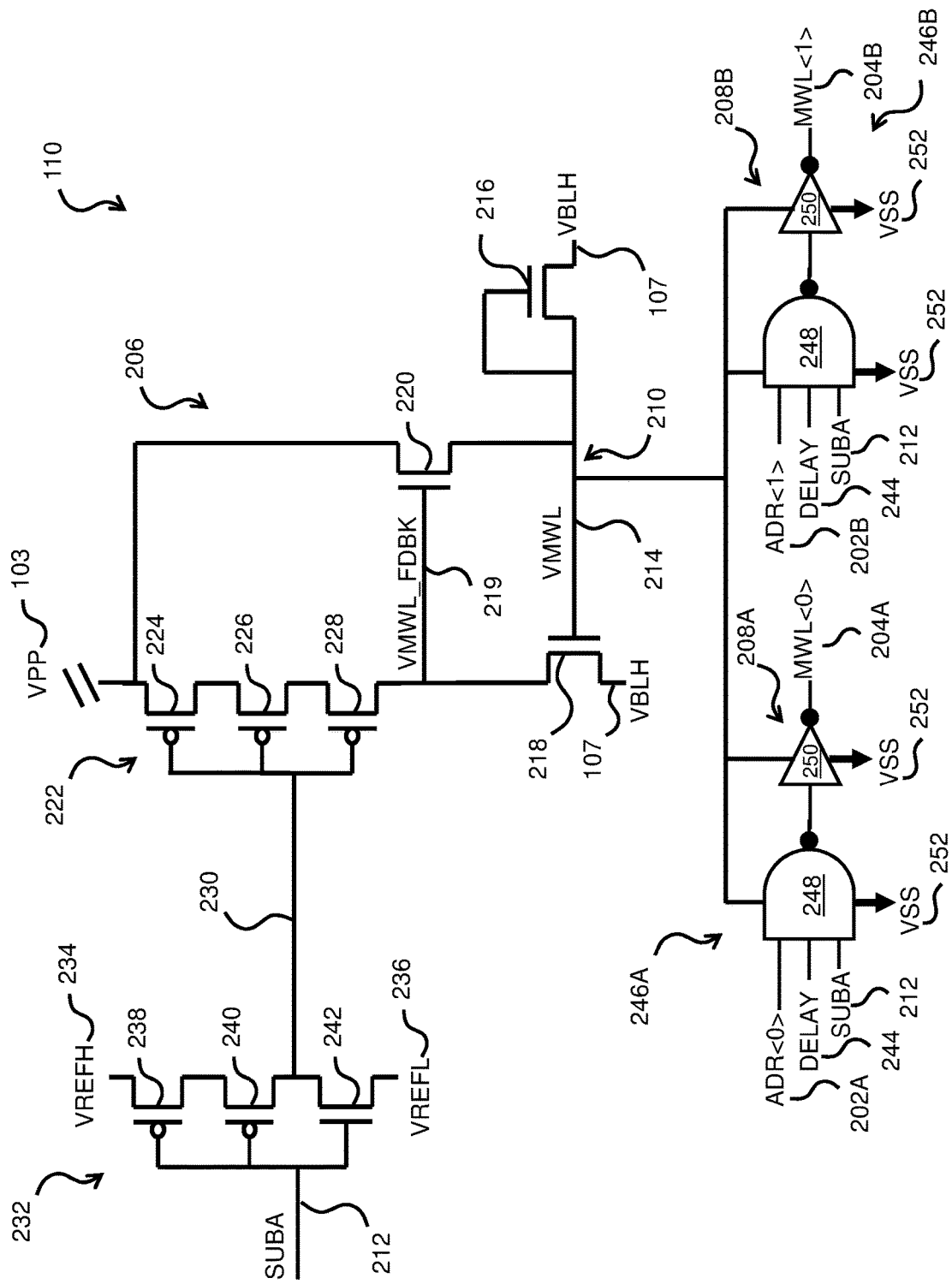
FIG. 2 is a block diagram of components of a bitline-mux driver circuit in accordance with one or more embodiments of the present invention.

FIG. 2 is a block diagram of components of the bitline-mux driver circuit 110 of FIG. 1 in accordance with one or more embodiments of the present invention. The system 100 of FIG. 1 may include multiple instances of the bitline-mux driver circuit 110 for groups of address input signals 202A, 202B and master wordline (MWL) outputs 204A, 204B, where each instance of the bitline-mux driver circuit 110 can be independently addressed. The bitline-mux driver circuit 110 includes a header circuit 206 and a plurality of driver circuits 208A, 208B coupled to the header circuit 206. The header circuit 206 can include a voltage divider with diode header circuit 210 and is operable to receive a subarray activation (SUBA) signal 212, boost a driver voltage (VMWL) 214 through the voltage divider with diode header circuit 210 based on the SUBA signal 212 to set the driver voltage 214 to a value above a standard supply voltage (VDD) 104 of FIG. 1 and between a VBLH 107 level and a VPP 103 level. The driver circuits 208A, 208B are operable to receive the driver voltage 214, to drive the master wordline (MWL) output 204A, 204B to select which bitline should be connected to the sense amplifier inside of a computer memory module based on an address input signal 202A, 202B and the driver voltage 214.

Figure 3:
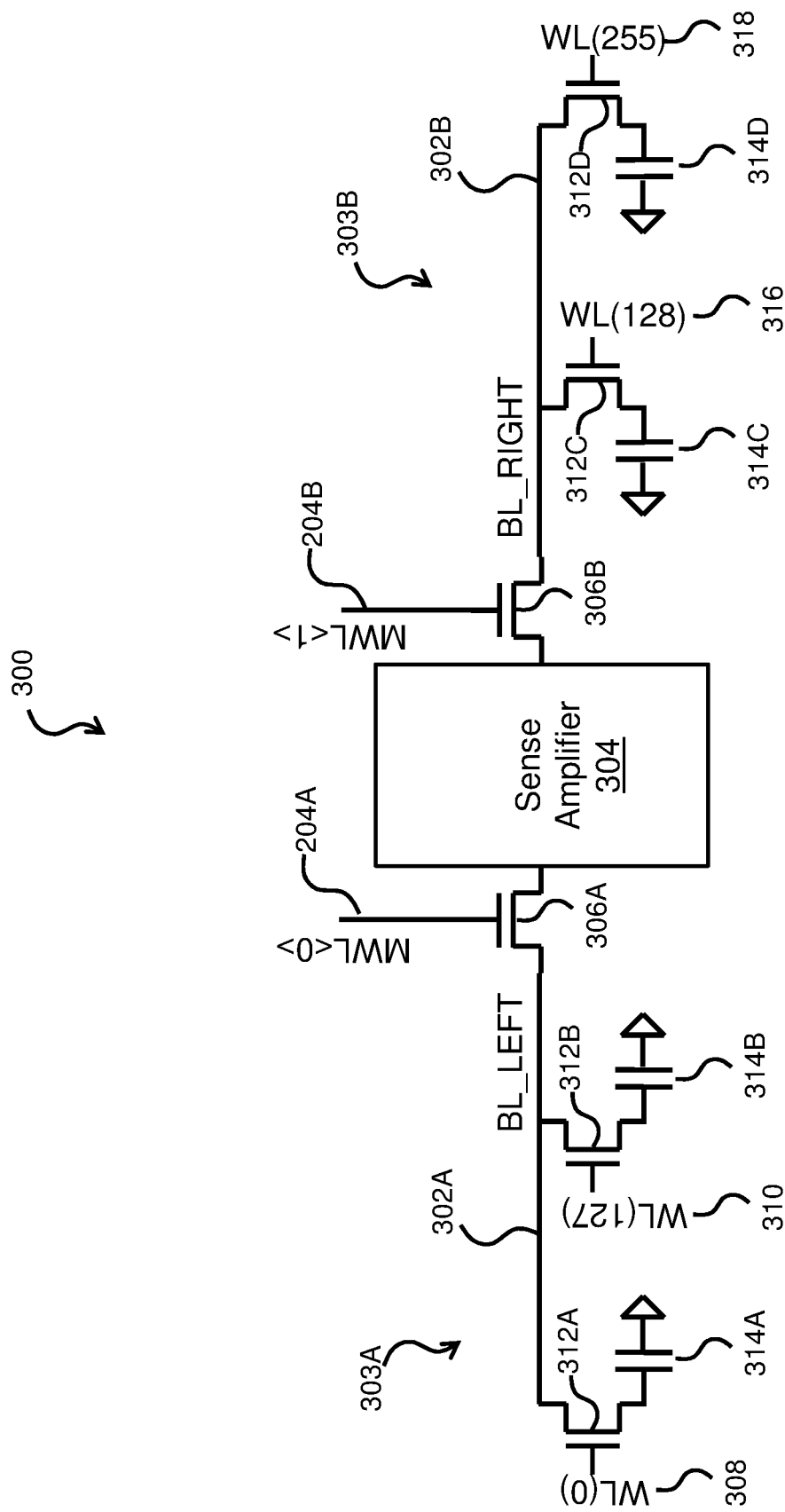
FIG. 3 is a block diagram of components of a cell array and sense amplifier circuit in accordance with one or more embodiments of the present invention.

Since the VPP 103 level exceeds a maximum allowed voltage (VMAX) level of the driver circuits 208A, 208B, the voltage divider with diode header circuit 210 (also referred to as VDDH circuit 210) can boost the driver voltage 214 to an elevated but safe voltage to improve the performance of components, such as gates of NFETs coupled to the master wordline (MWL) output 204A, 204B, as further described herein in reference to FIG. 3. The voltage divider with diode header circuit 210 can include a diode-configured FET 216 coupled to the VBLH 107 level, a feedback control FET 218 coupled to the VBLH 107 level, and a voltage-boosting control FET 220 coupled to the VPP 103 level. The diode-configured FET 216 can be a complimentary-metal-oxide-semiconductor (CMOS) diode formed, for example, by connecting a gate and drain of an NFET. In standby when SUBA is low, the driver voltage 214 may sit at a level of VBLH 107 plus a voltage threshold (VT). This voltage is achieved due to a PFET stack 222 also referred to as a stack of FETs 222) being off, which causes VMWL_FDBK to go close to VBLH voltage, hence turning off NMOS 220. With NMOS 220 off, VMWL will go to VBLH plus VT voltage. This lower voltage also reduces the current leaking through the drivers 208A and 208B. During activation when SUBA is high the signal 230 goes to VREFL allowing VPP to transfer to node VMWL_FDBK. With node VMWL_FDBK at VPP 103 is connected through the voltage-boosting control FET 220, which causes the driver voltage 214 to be between VPP-VT and VBLH as a boosted intermediate voltage above VDD and VBLH 107 but below VPP 103 and VMAX.

A gate of the diode-configured FET 216 can be coupled to the driver voltage 214, and a gate of the feedback control FET 218 can be coupled to the driver voltage 214. A gate of the voltage-boosting control FET 220 can be coupled to the feedback control FET 218 and the stack of FETs 222 which is also coupled to the VPP 103 level. The stack of FETs 222 can include a chain of three p-type FETs (PFETS) 224, 226, 228. PFET 224 can be coupled to VPP 103, voltage-boosting control FET 220, and PFET 226. PFET 228 can be coupled to PFET 226, a gate of voltage-boosting control FET 220, and feedback control FET 218. A feedback signal (VMWL_FDBK) 219 at the gate of voltage-boosting control FET 220 can control whether the VPP 103 voltage passed to the driver voltage 214. Gates of PFETs 224, 226, 228 (i.e., gates of the stack of FETs 222) may all be tied together and driven by an output 230 of a level-shifting inverter 232. The level-shifting inverter 232 is operable to pass a representation of the SUBA signal 212 to gates of the stack of FETs 222. The level-shifting inverter 232 can output a high reference voltage (VREFH) 234 that exceeds a maximum value of the SUBA signal 212 based on the SUBA signal 212 being in a deactivated state and a low reference voltage (VREFL) 236 that is between the maximum value and a minimum value of the SUBA signal 212 based on the SUBA signal 212 being in an activated state. In some embodiments, the SUBA signal 212 has a maximum value equivalent to supply voltage VDD and minimum value of zero volts. As one example, VREFH 234 can be about 1.05 volts and VREFL 236 can be about 0.45 volts. The level-shifting inverter 232 can include a PFETs 238, 240 and NFET 242. PFET 238 can be coupled to VREFH 234 and PFET 240. NFET 242 can be coupled to PFET 240 and VREFL 236. The gates of PFETs 238, 240 and NFET 242 can be tied together and driven by SUBA signal 212. The level-shifting inverter 232 can provide an assertion signal to the gates of the stack of FETs 222 with VREFL 236 being above zero volts and a de-assertion signal with VREFH 234 being a high enough value to mostly turn off the PFET stack 222.

The bitline-mux driver circuit 110 can receive the address input signals 202A, 202B, the SUBA signal 212, and a delay signal 244 at an AND-gate circuit 246A, 246B of the driver circuits 208A, 208B respectively. The delay signal 244 can be controlled to apply a delay period to a state change of the master wordline (MWL) output 204A, 204B as the driver voltage 214 changes in response to the SUBA signal 212 received at the header circuit 206. The AND-gate circuits 246A, 246B, each can include a NAND gate 248 coupled to an inverter 250 and can be powered by the driver voltage 214 relative to a source-substrate voltage (VSS) 252. Signals such as the address input signals 202A, 202B, the SUBA signal 212, and delay signal 244 can be input as a portion of the control bits 102 of FIG. 1. Outputs such as the master wordline (MWL) outputs 204A, 204B are examples of the master wordline output 112 of FIG. 1.

It is to be understood that the block diagram of FIG. 2 is not intended to indicate that the circuit 110 necessarily includes all of the components shown in FIG. 2. Rather, the circuit 110 can include any appropriate fewer or additional components not illustrated in FIG. 2 (e.g., NFETs, PFETs, diodes, voltages, resistors, capacitors, connections between circuit elements, ground connections, control bits, etc.). The FETs of FIG. 2 may have various numbers of fins. The components of FIG. 2 may be implemented as high voltage threshold components to reduce the risk of unintended state changes and/or for other reasons. Further, the embodiments described herein with respect to circuit 110 may be implemented with any appropriate logic, wherein the logic, as referred to herein, can include any suitable hardware (e.g., a processor, an embedded controller, or an application specific integrated circuit, among others), software (e.g., an application, among others), firmware, or any suitable combination of hardware, software, and firmware, in various embodiments.

FIG. 3 is a block diagram of components of a cell array and sense amplifier circuit 300 in accordance with one or more embodiments of the present invention. The cell array and sense amplifier circuit 300 can represent a portion of the cell array and sense amplifier 109 of FIG. 1, where multiple instances of the cell array and sense amplifier circuit 300 can be implemented in an eDRAM memory module. The master wordline (MWL) output 204A can be used to activate or deactivate a conduction path between a bitline 302A mux of a left-side bitline circuit 303A and a sense amplifier 304 through a FET 306A. Similarly, master wordline output 204B can be used to activate or deactivate a conduction path between a bitline 302B mux of a right-side bitline circuit 303B and the sense amplifier 304 through a FET 306B. When a single wordline (WL) is activated along the bitline 303A, the corresponding MWL signal 204A will also be activated. The WL 308, 310, 316, 318 can be driven, for example, by the interface control 101 of FIG. 1 as control bits 102 that pass through the row decoder driver 108 as selection bits 105 or may be generated by other circuitry (not depicted). A first memory cell FET 312A can be coupled to a first memory cell capacitor 314A, bitline 302A, and the first WL 308 that supplies a gate voltage. A second memory cell FET 312B can be coupled to a second memory cell capacitor 314B, bitline 302A, and the second WL 310 that supplies a gate voltage. A third memory cell FET 312C can be coupled to a third memory cell capacitor 314C, bitline 302B, and a third WL 316 that supplies a gate voltage. A fourth memory cell FET 312D can be coupled to a fourth memory cell capacitor 314D, bitline 302B, and a fourth WL 318 that supplies a gate voltage.

In the example of FIG. 3, FETs 306A, 306B, 312A, 312B, 312C, 312D are implemented as NFETs. The boosted voltage on master wordline outputs 204A, 204B can improve switching performance of FETs 306A, 306B with respect to bitlines 302A, 302B for logical one conditions at gates of the FETs 306A, 306B by creating a larger voltage differential compared to the supply voltage VDD 104 while also maintaining VMAX conditions.

It is to be understood that the block diagram of FIG. 3 is not intended to indicate that the circuit 300 necessarily includes all of the components shown in FIG. 3. Rather, the circuit 300 can include any appropriate fewer or additional components not illustrated in FIG. 3 (e.g., NFETs, PFETs, diodes, voltages, resistors, capacitors, connections between circuit elements, ground connections, control bits, etc.). The FETs of FIG. 3 may have various numbers of fins. The components of FIG. 3 may be implemented as high voltage threshold components to reduce the risk of unintended state changes and/or for other reasons. Further, the embodiments described herein with respect to circuit 300 may be implemented with any appropriate logic, wherein the logic, as referred to herein, can include any suitable hardware (e.g., a processor, an embedded controller, or an application specific integrated circuit, among others), software (e.g., an application, among others), firmware, or any suitable combination of hardware, software, and firmware, in various embodiments.

Figure 4:
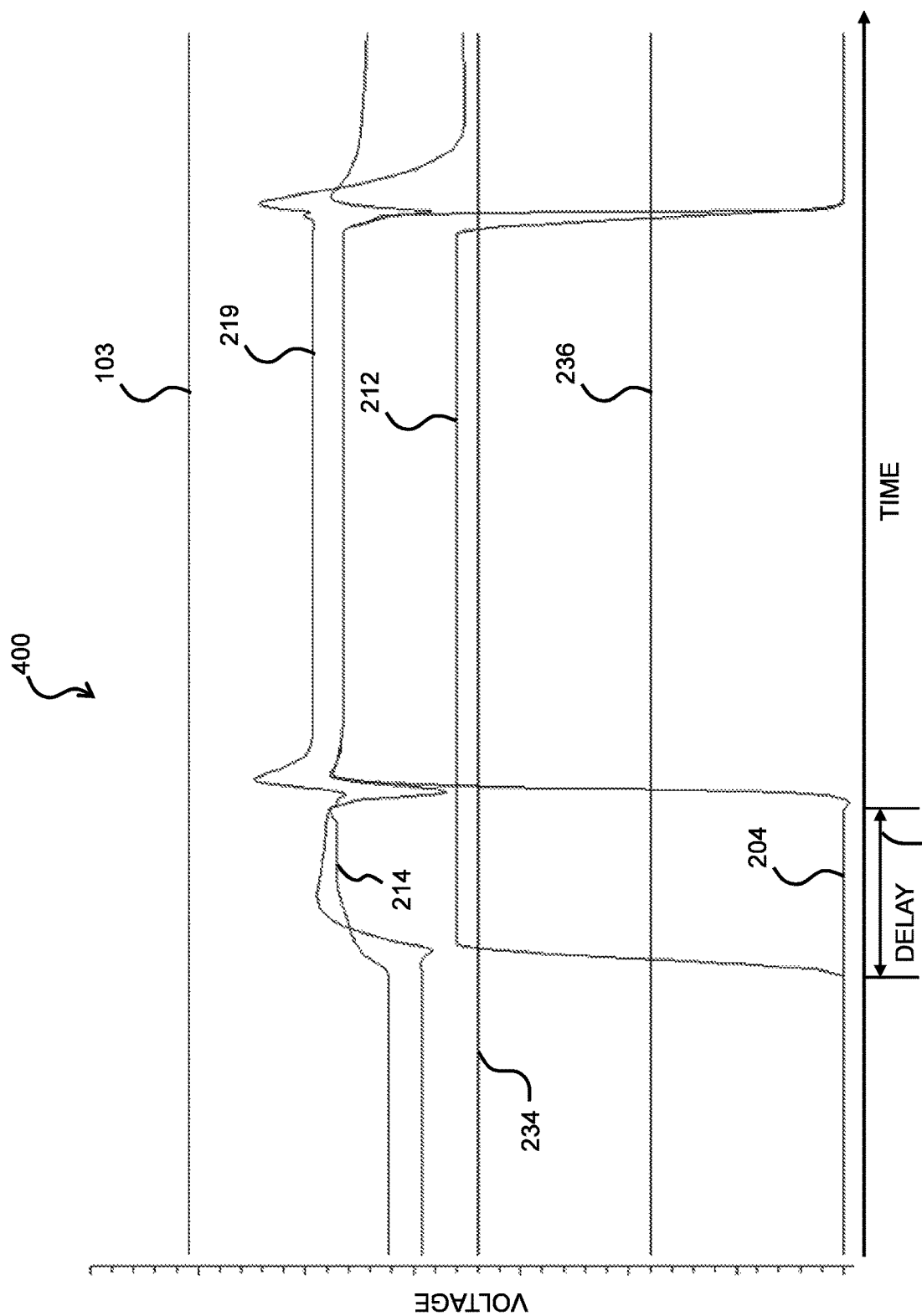
FIG. 4 is a plot of signals of a bitline-mux driver circuit in accordance with one or more embodiments of the present invention.

FIG. 4 is a plot 400 in accordance with one or more embodiments of the present invention. VPP 103 establishes a highest voltage in plot 400. Other reference voltages can include VREFH 234 and VREFL 236. SUBA signal 212 can transition from deactivated to activated with a corresponding instance of master wordline output 204 delayed by a delay period 402 (e.g., responsive to delay signal 244 of FIG. 2). The voltage level of the master wordline output 204 is boosted to match the driver voltage 214 as controlled by the state of the feedback signal 219 responsive to the SUBA signal 212. When the SUBA signal 212 is deactivated, the voltages of the master wordline output 204 will go to ground, driver voltage 214 will slowly recover to about VBLH, and feedback signal 219 will slowly recover to a voltage slightly higher than voltage 234.

Figure 5:
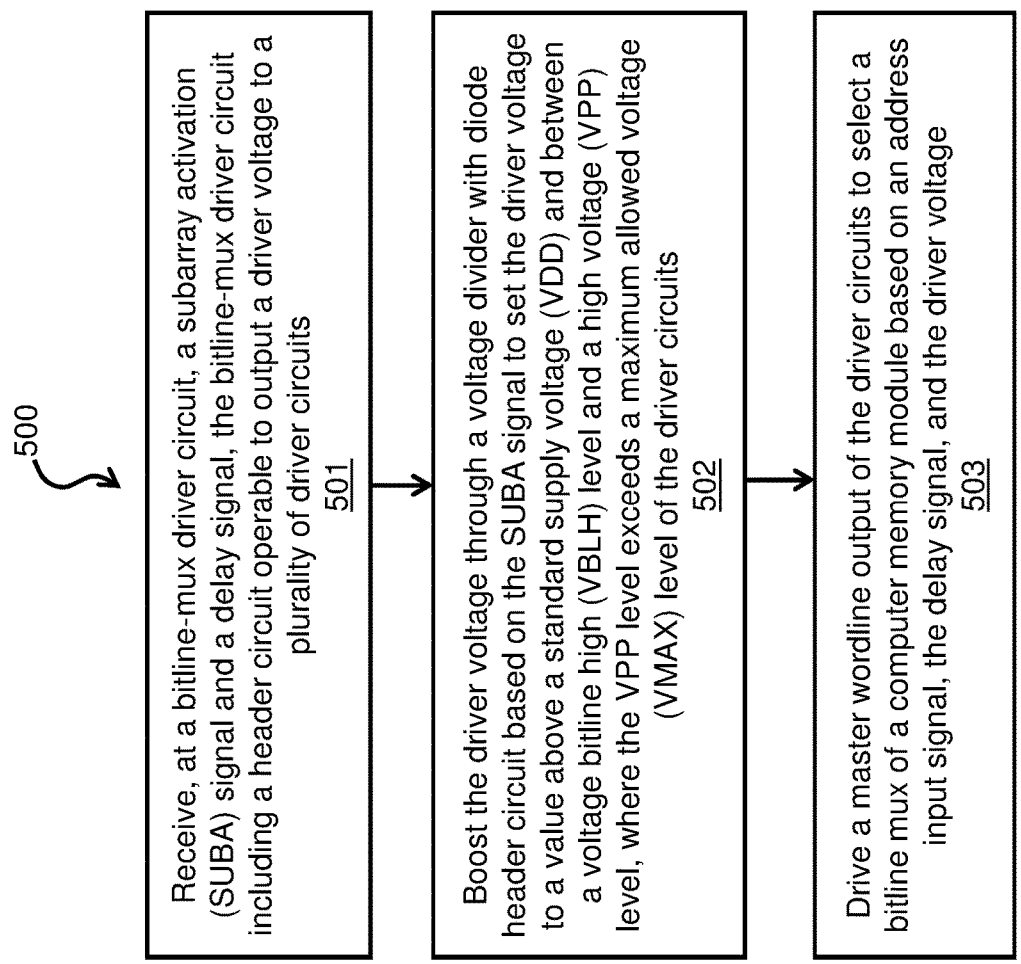
FIG. 5 is a flow diagram of a process for controlling a bitline-mux driver circuit in accordance with one or more embodiments of the present invention.

FIG. 5 shows a process flow diagram of a method 500 for controlling a bitline-mux driver circuit 110 in accordance with one or more embodiments of the present invention. Method 500 may be implemented in the system 100 of FIG. 1. Method 500 can be performed during operation of a memory module that includes the system 100, such as an eDRAM memory module that is embedded in a processor chip.

At block 501, a subarray activation (SUBA) signal 212 and a delay signal 244 can be received at a bitline-mux driver circuit 110. The bitline-mux driver circuit 110 can include a header circuit 206 operable to output a driver voltage 214 to a plurality of driver circuits 208A, 208B.

At block 502, the driver voltage 214 can be boosted through a voltage divider with diode header circuit 210 based on the SUBA signal 212 to set the driver voltage 214 to a value above a standard supply voltage (VDD) and between a voltage bitline high (VBLH) 107 level and a high voltage (VPP) 103 level, where the VPP 103 level exceeds a maximum allowed voltage (VMAX) level of the driver circuits 208A, 208B.

At block 503, a master wordline output 204A, 204B of the driver circuits 208A, 208B can be driven to select a bitline 302A, 302B mux of a computer memory module based on an address input signal 202A, 202B, the delay signal 244, and the driver voltage 214.

In embodiments, the SUBA signal 212 can be passed through a level-shifting inverter 232 to a plurality of gates of a stack of FETs 222, where the level-shifting inverter 232 outputs a high reference voltage (VREFH) 234 that exceeds a maximum value of the SUBA signal 212 based on the SUBA signal 212 being in a deactivated state and a low reference voltage (VREFL) 236 that is between the maximum value and a minimum value of the SUBA signal 212 based on the SUBA signal 212 being in an activated state. The address input signal 202A, 202B, the SUBA signal 212, and a delay signal 244 can be provided to an AND-gate circuit 246A, 246B of the driver circuits 208A, 208B. The delay signal 244 can be controlled to apply a delay period to a state change of the master wordline output 204A, 204B as the driver voltage 214 changes in response to the SUBA signal 212 received at the header circuit 206.

The process flow diagram of FIG. 5 is not intended to indicate that the operations of the method 500 necessarily be executed in any particular order, or that all of the operations of the method 500 are to be included in every case. Additionally, the method 500 can include any suitable number of additional operations.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

One or more of the methods described herein can be implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

In some embodiments, various functions or acts can take place at a given location and/or in connection with the operation of one or more apparatuses or systems. In some embodiments, a portion of a given function or act can be performed at a first device or location, and the remainder of the function or act can be performed at one or more additional devices or locations.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The present disclosure has been presented for purposes of illustration and description, but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The diagrams depicted herein are illustrative. There can be many variations to the diagram or the steps (or operations) described therein without departing from the spirit of the disclosure. For instance, the actions can be performed in a differing order or actions can be added, deleted or modified. Also, the term "coupled" describes having a signal path between two elements and does not imply a direct connection between the elements with no intervening elements/connections therebetween. All of these variations are considered a part of the present disclosure.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method comprising:
   receiving, at a bitline-mux driver circuit, a subarray activation (SUBA) signal and a delay signal, the bitline-mux driver circuit comprising a header circuit and a plurality of driver circuits, the header circuit operable to output a driver voltage to the driver circuits;
   boosting the driver voltage through a voltage divider with diode header (VDDH) circuit based on the SUBA signal to set the driver voltage to a value above a standard supply voltage (VDD) and between a voltage bitline high (VBLH) level and a high voltage (VPP) level, wherein the VPP level exceeds a maximum allowed voltage (VMAX) level of the driver circuits; and
   driving a master wordline output of the driver circuits to select a bitline mux of a computer memory module based on an address input signal, the delay signal, and the driver voltage.

2. The method of claim 1, wherein the VDDH circuit comprises a diode-configured field effect transistor (FET) coupled to the VBLH level, a feedback control FET coupled to the VBLH level, and a voltage-boosting control FET coupled to the VPP level.

3. The method of claim 2, wherein a gate of the diode-configured FET is coupled to the driver voltage, the gate of the feedback control FET is coupled to the driver voltage, and the gate of the voltage-boosting control FET is coupled to the feedback control FET and a stack of FETs further coupled to the VPP level.

4. The method of claim 3, further comprising:
   passing the SUBA signal through a level-shifting inverter to a plurality of gates of the stack of FETs, wherein the level-shifting inverter outputs a high reference voltage (VREFH) that exceeds a maximum value of the SUBA signal based on the SUBA signal being in a deactivated state and a low reference voltage that is between the maximum value and a minimum value of the SUBA signal based on the SUBA signal being in an activated state.

5. The method of claim 1, further comprising:
   providing the address input signal, the SUBA signal, and the delay signal to an AND-gate circuit of the driver circuits, wherein the delay signal is controlled to apply a delay period to a state change of the master wordline output as the driver voltage changes in response to the SUBA signal received at the header circuit.

6. The method of claim 5, wherein the AND-gate circuit comprises a NAND gate coupled to an inverter and powered by the driver voltage.

7. The method of claim 1, wherein the computer memory module comprises an embedded dynamic access memory (eDRAM) memory module that is embedded in a processor chip.

8. A system comprising a circuit configured to:
   receive, at a bitline-mux driver circuit, a subarray activation (SUBA) signal and a delay signal, the bitline-mux driver circuit comprising a header circuit and a plurality of driver circuits, the header circuit operable to output a driver voltage to the driver circuits;
   boost the driver voltage through a voltage divider with diode header (VDDH) circuit based on the SUBA signal to set the driver voltage to a value above a standard supply voltage (VDD) and between a voltage bitline high (VBLH) level and a high voltage (VPP) level, wherein the VPP level exceeds a maximum allowed voltage (VMAX) level of the driver circuits; and
   drive a master wordline output of the driver circuits to select a bitline mux of a computer memory module based on an address input signal, the delay signal, and the driver voltage.

9. The system of claim 8, wherein the VDDH circuit comprises a diode-configured field effect transistor (FET) coupled to the VBLH level, a feedback control FET coupled to the VBLH level, and a voltage-boosting control FET coupled to the VPP level.

10. The system of claim 9, wherein a gate of the diode-configured FET is coupled to the driver voltage, the gate of the feedback control FET is coupled to the driver voltage, and the gate of the voltage-boosting control FET is coupled to the feedback control FET and a stack of FETs further coupled to the VPP level.

11. The system of claim 10, wherein the circuit is configured to:
   pass the SUBA signal through a level-shifting inverter to a plurality of gates of the stack of FETs, wherein the level-shifting inverter outputs a high reference voltage (VREFH) that exceeds a maximum value of the SUBA signal based on the SUBA signal being in a deactivated state and a low reference voltage that is between the maximum value and a minimum value of the SUBA signal based on the SUBA signal being in an activated state.

12. The system of claim 8, the circuit is configured to:
   provide the address input signal, the SUBA signal, and the delay signal to an AND-gate circuit of the driver circuits, wherein the delay signal is controlled to apply a delay period to a state change of the master wordline output as the driver voltage changes in response to the SUBA signal received at the header circuit.

13. The system of claim 12, wherein the AND-gate circuit comprises a NAND gate coupled to an inverter and powered by the driver voltage.

14. The system of claim 8, wherein the computer memory module comprises an embedded dynamic access memory (eDRAM) memory module that is embedded in a processor chip.

15. A bitline-mux driver circuit comprising:
a header circuit comprising a voltage divider with diode header (VDDH) circuit, the header circuit operable to receive a subarray activation (SUBA) signal, boost a driver voltage through the VDDH circuit based on the SUBA signal to set the driver voltage to a value above a standard supply voltage (VDD) and between a voltage bitline high (VBLH) level and a high voltage (VPP) level; and
a plurality of driver circuits operable to receive the driver voltage, drive a master wordline output to select a bitline mux of a computer memory module based on an address input signal, a delay signal, and the driver voltage, wherein the VPP level exceeds a maximum allowed voltage (VMAX) level of the driver circuits.

16. The bitline-mux driver circuit of claim 15, wherein the VDDH circuit comprises a diode-configured field effect transistor (FET) coupled to the VBLH level, a feedback control FET coupled to the VBLH level, and a voltage-boosting control FET coupled to the VPP level.

17. The bitline-mux driver circuit of claim 16, wherein a gate of the diode-configured FET is coupled to the driver voltage, the gate of the feedback control FET is coupled to the driver voltage, and the gate of the voltage-boosting control FET is coupled to the feedback control FET and a stack of FETs further coupled to the VPP level.

18. The bitline-mux driver circuit of claim 17, further comprising a level-shifting inverter to a plurality of gates of the stack of FETs operable to pass the SUBA signal, wherein the level-shifting inverter outputs a high reference voltage (VREFH) that exceeds a maximum value of the SUBA signal based on the SUBA signal being in a deactivated state and a low reference voltage that is between the maximum value and a minimum value of the SUBA signal based on the SUBA signal being in an activated state.

19. The bitline-mux driver circuit of claim 15 configured to:
provide the address input signal, the SUBA signal, and the delay signal to an AND-gate circuit of the driver circuits, wherein the delay signal is controlled to apply a delay period to a state change of the master wordline output as the driver voltage changes in response to the SUBA signal received at the header circuit.

20. The bitline-mux driver circuit of claim 15, wherein the computer memory module comprises an embedded dynamic access memory (eDRAM) memory module that is embedded in a processor chip.

* * * * *